United States Patent
Nakashima et al.

[19]

[11] Patent Number: 5,918,136

[45] Date of Patent: *Jun. 29, 1999

[54] SOI SUBSTRATE AND METHOD OF PRODUCING THE SAME

[75] Inventors: Sadao Nakashima; Katsutoshi Izumi, both of Chiyoda-ku; Norihiko Ohwada, Musashino; Tatsuhiko Katayama, Hiratsuka, all of Japan

[73] Assignees: Komatsu Electronic Metals Co., Ltd.,, Kanagawa; Nippon Telegraph and Telephone Corporation; NTT Electronics Technology Corporation, both of Tokyo, Japan

[*] Notice: This patent is subject to a terminal disclaimer.

[21] Appl. No.: 08/915,301

[22] Filed: Aug. 19, 1997

Related U.S. Application Data

[63] Continuation of application No. 08/403,518, Mar. 13, 1995, Pat. No. 5,658,809.

[30] Foreign Application Priority Data

Mar. 23, 1994 [JP] Japan ........................................ 6-76538

[51] Int. Cl.$^6$ ..................................................... H01L 21/76
[52] U.S. Cl. .......................... 438/404; 438/407; 438/423; 438/766
[58] Field of Search .................................... 438/766, 765, 438/404, 407, 423

[56] References Cited

U.S. PATENT DOCUMENTS

| | | |
|---|---|---|
| 4,749,660 | 6/1988 | Short et al. . |
| 4,824,698 | 4/1989 | Jastrzebski et al. . |
| 4,975,126 | 12/1990 | Margail et al. . |
| 5,116,771 | 5/1992 | Karulkar . |
| 5,196,355 | 3/1993 | Wittkower . |
| 5,310,689 | 5/1994 | Tomozane et al. . |
| 5,658,809 | 8/1997 | Nakashima et al. .................... 438/766 |

FOREIGN PATENT DOCUMENTS

| | | |
|---|---|---|
| 0570057 | 11/1993 | European Pat. Off. . |
| 0595233 | 5/1994 | European Pat. Off. . |
| 4264724 | 9/1992 | Japan . |

OTHER PUBLICATIONS

J. Stoemenos et al, "New Conditions for Synthesizing SOI Structures by High Dose Oxygen Implantation", Journal of Crystal Growth, 73 (1985) 546–550.

C. Jaussaud, et al, "Defects in SIMOX Structures: Causes and Solutions", Vacuum, vol. 42, Nos. 5/6, pp. 341–347, 1991.

P.L.F. Hemment, et al, "Ion Beam Synthesis of Thin Buried Layers of $SiO_2$ in Silicon", Vacuum, vol. 36, Nos. 11/12, pp. 877–881, 1996.

P.L.F. Hemment, et al, "Nucleation and Growth of $SiO_2$ Precipitataes in SOI/SIMOX Related Materials—Dependence Upon Damage and Atomic Oxygen Profiles", Instruments and Methods in Physics Research, B39 (1989) 210–214.

(List continued on next page.)

Primary Examiner—Trung Dang
Attorney, Agent, or Firm—McAulay Nissen Goldberg Kiel & Hand, LLP

[57] ABSTRACT

A method of producing an SOI substrate having a single-crystal silicon layer on a buried oxide layer in an electrically insulating state from the substrate by implanting oxygen ions into a single crystal silicon substrate and practicing an anneal processing in an inert gas atmosphere at high temperatures to form the buried oxide layer. After the anneal processing in which the thickness of the buried oxide layer becomes a theoretical value in conformity with the thickness of the buried oxide layer formed by the implanted oxygen, the oxidation processing of the substrate is carried out in a high temperature oxygen atmosphere.

2 Claims, 9 Drawing Sheets

OTHER PUBLICATIONS

J. Stoemenos, et al, "SiO$_2$ Buried Layer Formation by Subcritical Dose Oxygen Ion Implantation", Appl. Phys. Lett. 48 (21), May 26, 1986, pp. 1470–1472.

J. Stoemenos, et al, "Nucleation and Growth of Oxide Precipitates in Silicon Implanted with Oxygen", Thin Solid Films, 135 (1986), 115–127.

IBM Technical Disclosure Bulletin, vol. 36, No. 11, Nov. 1993, New York, pp. 227–228 Low–Dose SIMOX with a Thin Burried Oxide.

Journal of Materials Research, Mar. 1993, 11, USA vol. 8, No. 3, pp. 523–534 Nakashima et al.

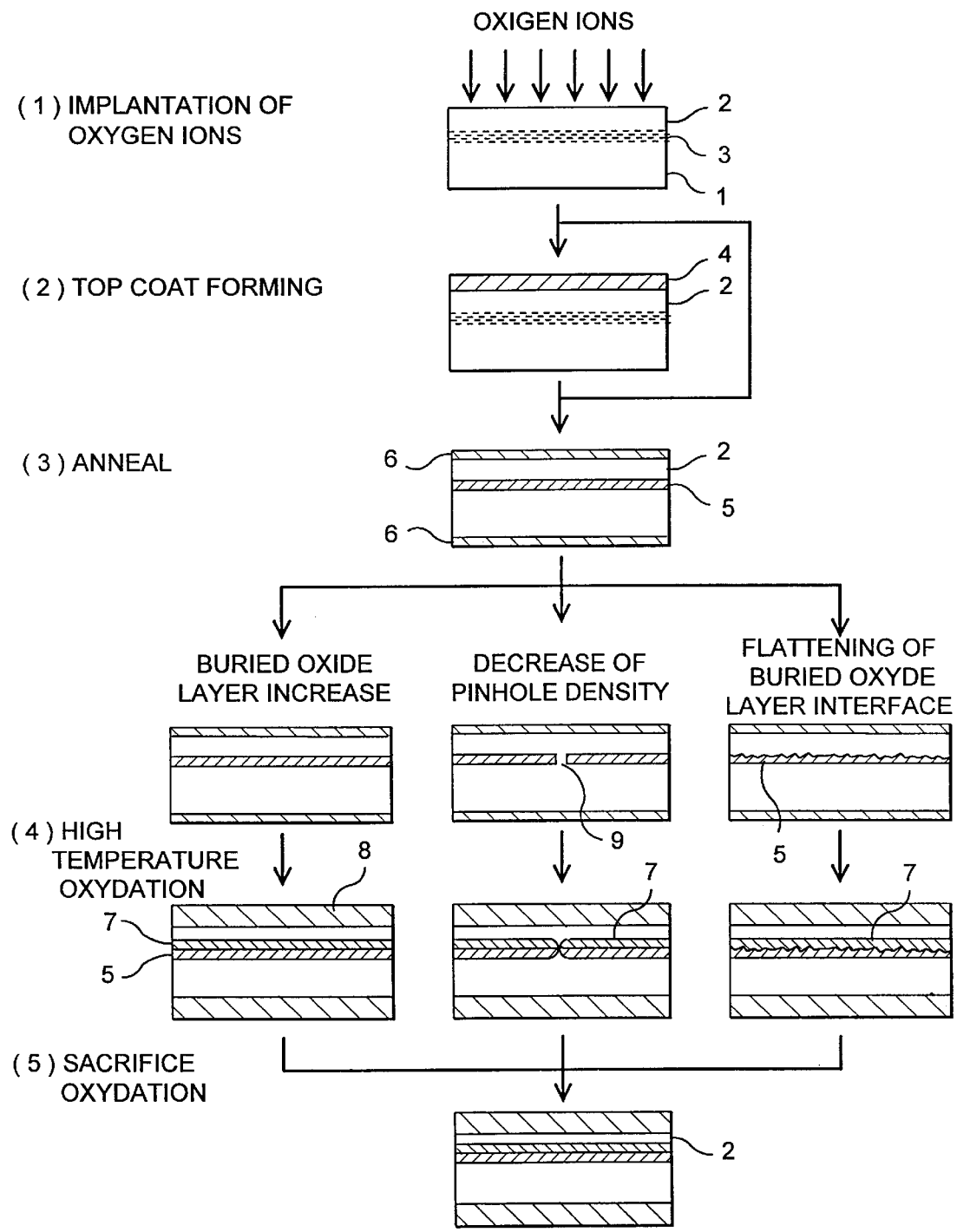
F I G. 1

_SOI SUBSTRATE AND METHOD OF PRODUCING THE SAME_

This is a continuation of application Ser. No. 08/403,518, filed Mar. 13, 1995.

BACKGROUND OF THE INVENTION

1. Field of the Invention

The present invention relates to an SOI substrate and a method of producing the SOI substrate having an insulation layer in a single crystal silicon substrate.

2. Description of the Related Art

It is known well that the thin single crystal silicon layer provided on an insulation layer is preferable than making an integrated circuit on the bulky single crystal silicon substrate in view of the electrical characteristics of the elements and separation of the respective elements.

A semiconductor substrate having, in an electrically insulated state, the surface single crystal silicon layer, in which the elements are formed, by making an insulation layer ($SiO_2$) in the single crystal silicon substrate is generally called as "SOI (Silicon On Insulator)". The semiconductor substrate can be produced by a wafer bonding method or an oxygen-ion implantation method. The former wafer bonding method is that an oxide layer is formed on the single crystal silicon substrate, next an other single crystal silicon substrate is stuck to join thereon and a thin active silicon layer is formed by means of the whetted one of the single crystal silicon substrate. The later oxygen-ion implantation method is called as SIMOX (Separation by IMplanted OXygen) and has attracted attention lately to be preferable to form a thin-film active silicon layer to avail of a large-scale integratize, which forms a buried oxide layer inside of the silicon substrate by being allowed to react with Si and O in a high temperature anneal processing (1,100–1,200° C.) after implanting a high-dose oxygen ion ($^{16}O^+$) into the single crystal silicon substrate. Particularly, a SIMOX substrate can cause the single crystal silicon substrate to be an active layer having an uniform thickness, though the surface single crystal silicon layer is not received with a processing of whet as a sticky substrate.

However, when the buried oxide layer is formed in the above-stated silicon substrate by the anneal processing after implanting the oxygen ions into the single crystal silicon substrate, there are following disadvantages.

(1) The high quality SIMOX substrate has a low dislocation density of the surface single crystal silicon and surpasses in the electrically insulated state of the buried oxide layer. But, since the buried oxide layer is thin and the thickness is 80–90 nm, if a particle 10 attaches on a surface of a single crystal silicon substrate 1 when the oxygen ion is implanted as shown in FIG. 9, impossible parts of being implanted will be remained in a high-dose oxygen-ions implantation layer 3 because the particle 10 takes place a masking effect. The high-dose oxygen-ions implantation layer 3 resultes in a buried oxide layer 5 by means of the anneal processing, but since the afore-mentioned impossible part of being implanted with the oxygen ions resultes in a pinhole 9, an electric insulation property is inferior. Incidentally, 2 means the surface single crystal silicon layer and 6 means a surface oxide layer formed by the anneal processing in FIG. 9.

(2) FIG. 10 charts a correlation between the dose of the oxygen ions and the dislocation density in the surface single crystal silicon layer (see J. Mater. Res., Vol. 8, No. 3, March 1993 pp. 523–534). In a substrate increased in a thickness of the buried oxide layer by being increased in the dose of the oxygen ions to $1.0 \times 10^{18}/cm^2$–$2.0 \times 10^{18}/cm^2$, a crystal defect, or the dislocation density is increased in the surface of single crystal silicon layer. Particularly, in and over $1.5 \times 10^{18}/cm^2$, the dislocation density is suddenly increased.

(3) In the substrate increased in the dose of the oxygen ions to $0.5 \times 10^{18}/cm^2$–$0.9 \times 10^{18}/cm^2$ within the range of the non-increasing crystal defect density, a strength of breakdown electric field in the buried oxide layer is a small range of 0–1 MV/cm and the electric insulation property is low as charted in FIG. 11.

(4) In the SIMOX substrate having the thin buried oxide layer, irregularity of an interface of the surface single crystal silicon and the buried oxide layer (abbreviated to "an buried oxide layer interface") is large (square root mean roughness Rms is about over 2 nm), a electrical characterstics of devices varies widely in ease. The thus SIMOX substrate can be sufficiently practiced to be flatness of the buried oxide layer through spending much time on the anneal processing, but it is impossible in view of its cost.

Accordingly, it is the first object of the present invention to provide an SOI substrate which can increase a thickness of its buried oxide layer without increasing the dose of implanted oxygen ions to prevent an increase of crystal defect in a surface single-crystal silicon layer. The second object of the present invention is to provid a method of producing the SOI substrate capable of decreasing a pinhole density in the buried oxide layer. The third object of the present invention is to provide a method of producing the SOI substrate which improves the flatness of the buried oxide layer interface. It is also an object of the present invention to provide the SOI substrate in which the crystal-defect density of the surface silicon layer is little, the buried oxide layer is increased more than a theoretical buried oxide layer thickness calculated from the dose of the implanted oxygen ions, the generation of pinholes is very little, and the flatness of the buried oxide layer interface is improved.

SUMMARY OF THE INVENTION

The present invention is characterized to conduct an anneal processing after implanting the oxygen ions into the single crystal silicon substrate and additionally conduct an oxidation process to SIMOX substrate having the theoretical buried oxide layer thickness calculated from the dose of the implanted oxygen after annealing the implanted substrate in a high temperature atmosphere at within a range of over 1150° C. and less than a melting temperature of the silicon to increase the thickness of the buried oxide layer more than the theoretically obtained thickness by the anneal processing. According to the present invention, even if the pinholes are made in the buried oxide layer by adhering the particles on the substrate surface when the oxygen ions are implanted, or if the roughness of the buried oxide layer interface is serious, the pinholes can be repaired by an additional treatment and the roughness of the interface is also flattened as expected. As has been mentioned above, the SIMOX obtained after such additional high temperature oxidation treatment is of a qualified SOI substrate in which the buried oxide layer is thickened, there are few pinholes in the buried oxide layer, the flatness of the buried oxide layer interface is improved compared with those of the conventional SIMOX substrate.

BRIEF DESCRIPTION OF THE DRAWINGS

FIG. 1 is an explaining diagram of development of the SOI substrate producing processing;

DETAILED DESCRIPTION OF THE PREFERRED EMBODIMENT(S)

Figure 3:
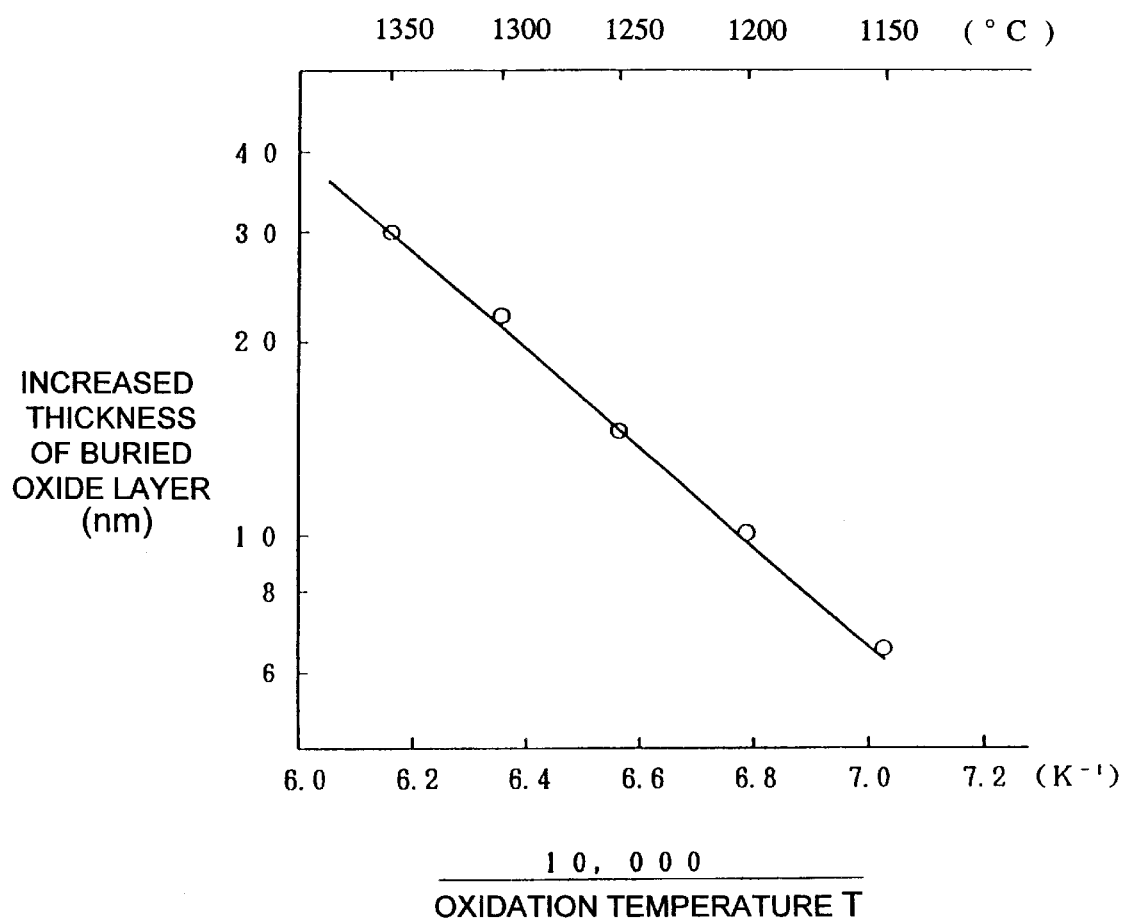
FIG. 3 is a chart of the mutuality between the increase quantity of the buried oxide layer and the oxidation temperature when the oxidation of about 180-nm-thick silicon is practiced on the surface single crystal silicon in the high temperature oxidation process.
Figure 4:
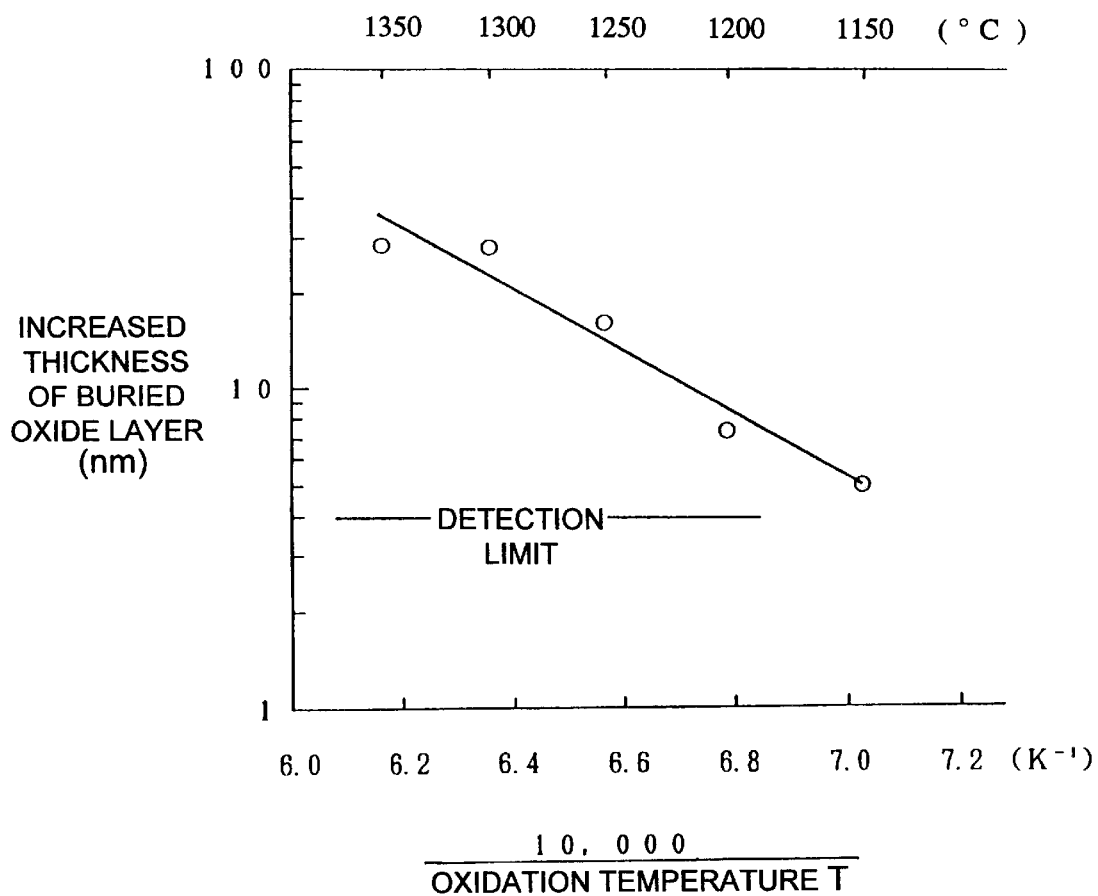
FIG. 4 is a chart of the mutuality between the increased thickness of the buried oxide layer and the oxidation temperature when the oxidation time is defined as four hours and the concentration of $O_2$ is determined at 70% in the high temperature oxidation process.

The present invention is materialized by detection of a phenomenon which the buried oxide layer grows in its layer when the high temperature oxidation treatment is practiced on the SIMOX substrate formed separately with the buried oxide layer by practicing the anneal processing after implanting the oxygen ions. The above-targeted SIMOX substrate is defined to include the thickness 320 nm of the surface active silicon layer and the thickness 89 nm of the buried oxide layer and is processed under the temperature set at 1350° C. and under an oxygen atmosphere controlled at a partial pressure (the same follow) of 70% $O_2$ in an inert gas argon (Ar) and it is carried out the thus-oxidation treatment for four hours. As a result, it is recognized that the buried oxide layer grows into 118 nm. Next, how the buried oxide layer increased is sought out by. controlling time in order to result in that the thickness of the thermally formed surface oxide layer is determined in about 400 nm (the oxidized thickness of the surface silicon layer is determined as 180 nm) under different oxidation temperatures changed by temperature conditions. As shown in FIG. 3, increasing the oxidation temperature, it is recognized that the thickness of the buried oxide layer is increased (the oxidation time: 77 min.–405 min.). The effect of increasing the layer thickness is recognized over 1150° C. Accordingly, it can be understood that the increase rate of the buried oxide layer thickness is high level although the thickness of the surface oxide layer is the same and the buried oxide layer is thickly oxidized as the temperature is higher. In the same way, FIG. 4 shows a state which the oxidation time is determined as four hours and the O2 concentration is determined as 70%. Accordingly, a temperature dependence of increasing the thickness of the layer when the oxidation time is determined specifically can be understood and it is natural that the temperature less than 1150° C. in an utilitarian scope is less than a detecting level. Incidentally, in the drawings, an oxidation temperature of the horizontal axis indicates a numerical value of $10^4$ times a reciprocal number of a absolute temperature. Celsius temperature is indicated upper the drawings.

As evidenced in the drawings, the thickness of the buried oxide layer is increased as the oxidation temperature is higher.

As can be known from the drawings, the buried oxide layer thickness can be increased upon an increase of oxidation temperature. When the oxidation temperature is on or less than 1150° C., the increased thickness of the buried oxide layer is slight or when the oxidation time is for four hours as practical time, the increased thickness is less than a detecting level not to show an effect of increasing the thickness, but if the oxidation temperature will be increased at 1350° C., an increase of the buried oxide layer thickness is about 30 nm. The buried oxide layer thickness of the conventional SIMOX is 80–90 nm, but in the present invention the buried oxide layer thickness reaches 100–110 nm when the oxidation treatment will be practiced at 1350° C. and the thickness o the surface oxide layer is 400 nm. It is therefore necessary to keep at least 1150° C. equal to the anneal processing temperature to attain a satisfactional increase of thickness. Incidentally, the maximum temperature should be lower than the melting temperature of the silicon, that is 1415° C.

Figure 5:
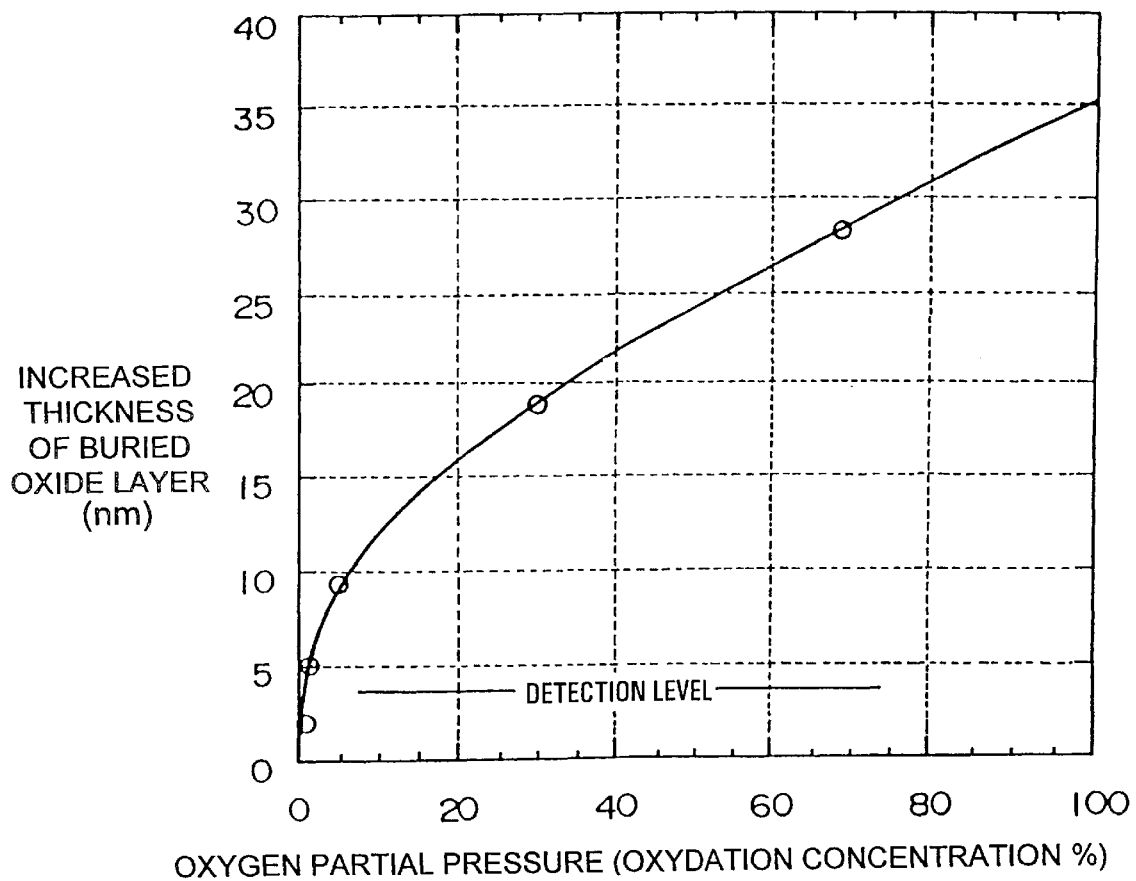
FIG. 5 is a mutual chart of the increased thickness of the buried oxide layer to the oxygen partial pressure in the high temperature oxidation process.

It is generally believed that the oxygen concentration in the oxygen atmosphere contributes to increase the thickness, so that when oxidizing at 1350° C. for four hours after the anneal processing and thereafter measuring the increase of the thickness of the buried oxide layer corresponding to a change of the oxygen partial pressure, a property chart as shown in FIG. 5 can be obtained. As can be known from the chart, the thickness increase can be expected when the concentration of $O_2$ is about over 1%. At 0.5%, the thickness increase is too slight to detect the increase because of the roughness of the buried oxide layer interface, so that the effect of increasing thickness of the buried oxide layer can be limitedly obtained when the oxygen concentration is over 1%. This is because that the oxygen in the atmosphere is diffused from at least the surface silicon layer and the substrate silicon layer into the inside, so that the additional formation of $SiO_2$ at the interface portion of the buried oxide layer can be generally regulated upon a temperature condition. It is therefore believed that the minimum concentration for diffusing to the silicon layer should be over 1% as mentioned above. But, as can be understood from FIG. 5, the increase of the oxygen concentration at a certain high temperature can cause the increase of the thickness.

If the thickness of the surface silicon layer is required to be thinned depending upon final device condition, a so-called sacrifice oxidation treatment will be practiced. The sacrifice oxidation treatment is to form an oxide layer at a surface by heat oxidation and to remove the oxide layer from the surface by means of a generally known method to thin the surface silicon layer by a thickness of the oxidized silicon. In order to avert an influence to the buried oxide layer thickness due to the sacrifice oxidation, the oxidation temperature should be set at a low temperature than the anneal temperature, more particularly at on or less than 1100° C. However, the sacrifice oxidation may be practiced before or after the thickness increase process for the buried oxide layer.

Accordingly, the producing method of the SOI substrate according to the present invention is characterized to have the steps of: implanting the oxygen ions into a single crystal silicon substrate; forming a buried oxide by an anneal process in which a high temperature process is practiced in an inert gas atmosphere; forming on the buried oxide layer a surface single-crystal silicon layer electrically insulating from the substrate by continuing the anneal process until the thickness of the buried oxide layer reaches a certain value theroretically calculated frim the dose of the implanted oxygen ions; and oxidizing the substrate in the high temperature oxidation atmosphere. Incidentally, the temperature of the high temperature oxidation process after the anneal process should be on or more than 1150° C. and less than a melting temperature of the single crystal silicon substrate and the high temperature oxidation process after the anneal process should be practiced in an oxygen gas atmosphere of which concentration is higher than that in the anneal process.

After the oxidation process in the high temperature oxidation atmosphere, the following steps can be further added that is to removing an oxide layer on surface of the substrate; practicing sacrifice oxidation at on or less that 1100° C.; and thinning the surface silicon layer by removing the sacrifice oxidation layer. The sacrifice oxidation is desirable to oxidize only the surface silicon layer but when oxidizing the SOI substrate over 1150° C., the thickness of the buried oxide layer is naturally increased not to be able to control the thickness, so that it is required to be set below the high temperature oxidation condition temperature. Accordingly, in the sacrifice oxidation, the upper limit temperature of 1100° C. not to influence the buried oxide layer thickness is recommended.

After practicing the anneal process until the thickness of the buried oxide layer reaches a certain value theoretically calculated from the dose of the implanted oxygen, a property chart showing the relationship between the increase of the buried oxide layer thickness and the oxidation temperature will be obtained. By increasing thickness of the buried oxide layer by oxidizing the substrate in a high temperature atmosphere at a temperature condition based on a preliminarily prepared property chart showing the relation between the increase of the buried oxide layer and the oxidation temperature in conformity with the increased thickness to close pinholes in the buried oxide layer, the restoration of defect in the buried insulation layer into which the ions were not implanted because of adhered particles can be attained and the beakdown electric strength of the insulation layer can be improved. The diameter and numbers of pinholes are changeable on an implantation condition of the oxygen ions and it is hard to directly understand the state of the pinhole, so that they should be obtained by a statistical way based on the ion implantation condition and the increased thickness of the buried oxide layer should be controlled to decrease a diameter of the main group pinholes. For example, when the diameter of a pinhole is 50 nm, the thickness increase is one half, that is 25 nm, so that it should be based thereon.

Figure 6:
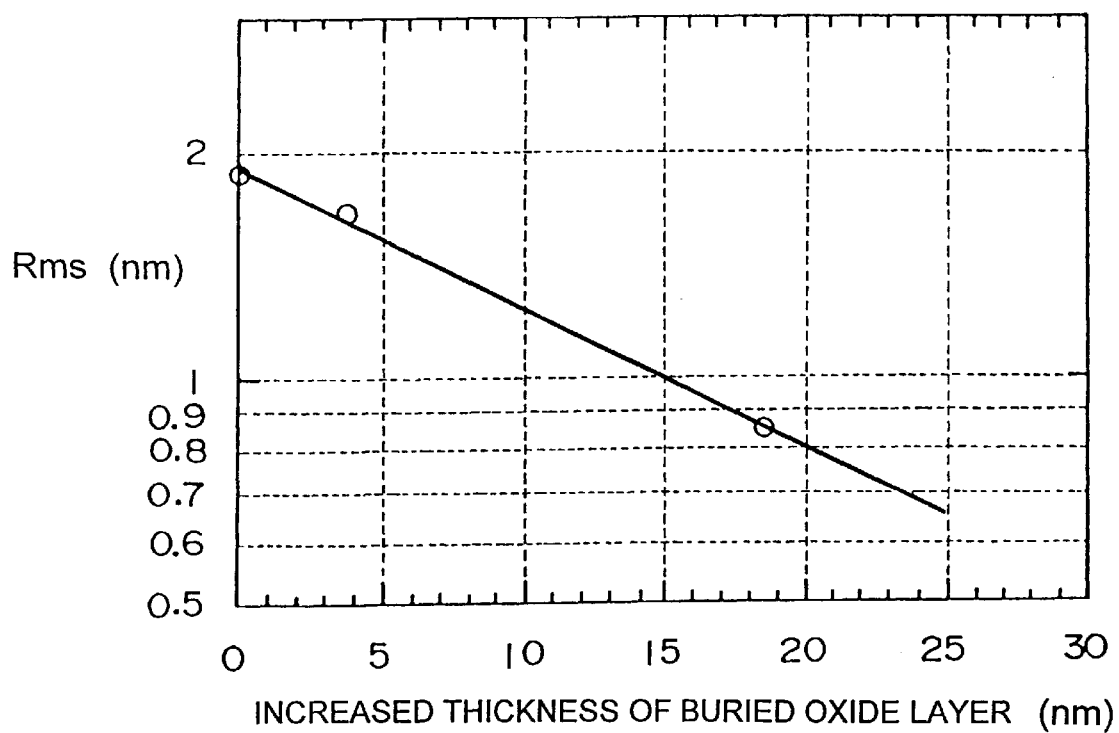
FIG. 6 is a property chart based on the relation of a square root mean roughness Rms to how the thickness of the buried oxide layer is increased.

By increasing thickness of the buried oxide layer by oxidizing the substrate in a high temperature atmosphere at a temperature condition based on the property chart showing the relation between the increase of the buried oxide layer thickness and the oxidation temperature in conformity with the increased thickness to flatten the buried oxide layer interface, the rough interface condition can be developed by the ion implantation to thereby reduce the deviation of the electrical characteristics of devices. Referring to an improvement of flattening, when a square root mean roughness Rms is calculated corresponding to an increase of increased thickness of the buried oxide layer, a property chart as shown in FIG. 6 can be obtained. The high temperature oxidation condition should be determined with reference to the property chart by which a necessary increase for flattening upon devices can be confirmed.

Furthermore, the substrate implanted by the oxygen ions is set in a furnace and heated, and under a low oxygen concentration condition for preventing a generation of surface pits, the anneal processing will be carried out such that the thickness of the buried oxide layer becomes theoretical value calculated from the dose of the implanted oxygen. In the high temperature and high concentration atmosphere after a certain increase of oxygen concentration, the thickness of the buried oxide layer can be increased by oxidizing the substrate having the buried oxide layer. The silicon substrate implanted by the oxygen ions is lead in the heat processing furnace in which the temperature is maintained at a range of 800–850° C. and the an inert gas are filled up not to generate crystal defects and is further heated until about 1100–1300° C. to obtain a stable state of its crystal. The gas atmosphere is controlled to include the oxygen by a concentration of 0.5% in order to prevent generation of pits on the surface in the anneal processing. When the temperature increase for the anneal processing in the low concentration oxygen atmosphere will be finished, the gas atmosphere temperature reaches at or over the anneal temperature. It is therefore necessary to regulate the oxygen concentration to maintain the oxygen partial pressure of, for example, 70% in the gas atmosphere, whereby the high temperature oxidation will be carried out at a constant temperature. The buried oxide layer in the substrate is that the oxide layer grows at the interface of the buried oxide layer of which the thickness depends upon the implanted oxygen ions, whereby the thickness of the buried oxide layer fromed becomes thicker than the theoretical value.

The SOI substrate produced by the above-mentioned method is that the thickness of the buried oxide layer exceeds 90 nm, the dislocation density of the surface silicon single crystal layer is on or less than 100 $cm^2$, the pinhole density of the buried oxide layer is on or less than 20 $cm^2$, and the square root mean roughness of the buried oxide layer interface is on or less than 1 nm. Accordingly, the present invention is to provide the qualified SOI substrate in which the buried oxide layer is thickened, there are few pinholes in the buried oxide layer, the flatness of the buried oxide layer interface is improved compared with those of the conventional SIMOX substrate.

As has been mentioned above, in accordance with the present invention, the SIMOX substrate which was conventionally under the anneal processing after the oxygen ions are implanted is further oxidized in the high temperature atmosphere at a range from on or more than 1150° C. to less than the melting temperature of the silicon, whereby a thickness increase of the buried oxide layer can be attained on the prior buried oxide layer. The thickness increase of the layer can be attained by setting the oxygen concentration at over 1% when oxidizing at a high temperature. When particles are adhered on the surface silicon single crystal layer when the oxygen ions are implanted and pinholes are generated in the buried oxide layer, or when the flatness of the buried oxide layer interface becomes worse, the addtional oxide layer generated through the high temperature oxidation treatment can repair the pinholes or improve the flatness. If the sacrifice oxidation processing will be carried out before or after the high temperature oxidation treatment, the surface silicon single crystal layer can be thinned to the expected level.

In the high temperature oxidation treatment, it can be separately conducted from the anneal processing against the substrate in which the buried oxide layer is formed in the prior anneal processing, but it will be also available to complete the anneal processing in the temperature increase process and to oxidize successively to increase the thickness of the buried oxide layer. In other words, the anneal processing will be practiced in the gas atmosphere containing therein the oxygen of low concentration while the temperature increases, and the oxidation treatment is practiced after the oxygen concentration is made strong to produce successively.

The preferred embodiment of the present invention will now be described with reference to the drawings.

FIG. 1 is an explanatory view showing successive processes for producing an SOI substrate in accordance with the present invention, the SOI substrate being depicted in section. The first process is of an oxygen-ion implantation process in which oxygen ions $^{16}O^+$ are implanted at a predetermined portion in depth in a single crystal silicon substrate 1 by means of an ion implanter. However, the dose of the implanted oxygen ions should be within $0.5 \times 10^{18}/cm^2$ to prevent a dislocation density of the surface silicon single crystal layer 2 from increasing and a strength of breakdown electric field across the buried oxide layer from decreasing. Incidentally, the reference numeral 3 in the drawings designates a layer of high-concentrated implantation of oxygen atmos.

The second process is of a top coat forming process in which an anneal top coat 4 of $SiO_2$ is formed on surface of the single crystal silicon substrate 1 by a CVD apparatus. But, it should not be understood that the anneal top coat is always necessary before the following third process.

The third process is called an anneal process in which the substrate is processed under a furnace atmosphere containing therein Ar gas having 0.5% partial oxygen pressure, being maintained at 850° C. first and thereafter the temperature will be increased at 1350° C. The above-explained anneal process is to stabilize the crystal state such that the layer of highly concentrated implantation of oxygen ions is transformed into a buried oxide layer 5. The reference numeral 6 should be understood to designate an oxide layer formed by the anneal process. As can be understood, the afore-described processes are the same with in the prior art.

Now referring to the fourth process, it is an oxidization process at a high temperature and, more particularly the single crystal silicon substrate 1 is heated at on or more than 1150° C. and less than its melting temperature for several hours. The $O_2$ gas concentration should be maintained in a range of over 1% and on or less than 100%. As shown in the drawings, there are acknowledged three resultant patterns after such oxidation treatment. The drawings on the let side in FIG. 1 show a process to increase the buried oxide layer 5 formed through the anneal process by a thickness of additionally formed buried oxide layer 7. The reference numeral 8 designates an increased oxide layer after the high temperature oxidation process. The drawings shown in the middle area in FIG. 1 explain how the pin hole 9, made in the buried oxide layer owing to the masking effect when the oxygen ions were implanted into the single crystal silicon substrate 1 having thereon the particle, will be eliminated. The drawings shown in the right area in FIG. 1 explain an interface flattening process of the buried oxide layer, wherein a surface irregularity of the buried oxide layer 5 can be flattened or smoothed off by the additionally formed buried oxide layer 7. The improvement of flattening can be acknowledged from FIG. 6 of a property chart based on a relation of a square root mean roughness Rms to how the buried oxide layer is increased. Accordingly, in case of applying to electrical devices the required flattening property of the increased buried oxide layer can be determined with reference to the property chart so that a preferable high temperature oxidation condition can be settled. Incidentally, the fourth process can be carried out after removing the oxide layer 6 formed through the third process. The fifth process is a sacrifice oxidation process of an oxidation treatment to make the surface single crystal silicon layer 2 become thinner. The sacrifice oxidation process may be carried out after removing the increased oxide layer 8. Otherwise, the sacrifice oxidation process may be done between the anneal process and the high temperature oxidation process. But, the sacrifice oxidation process can be conducted after removing the oxide layer 6.

Figure 2:
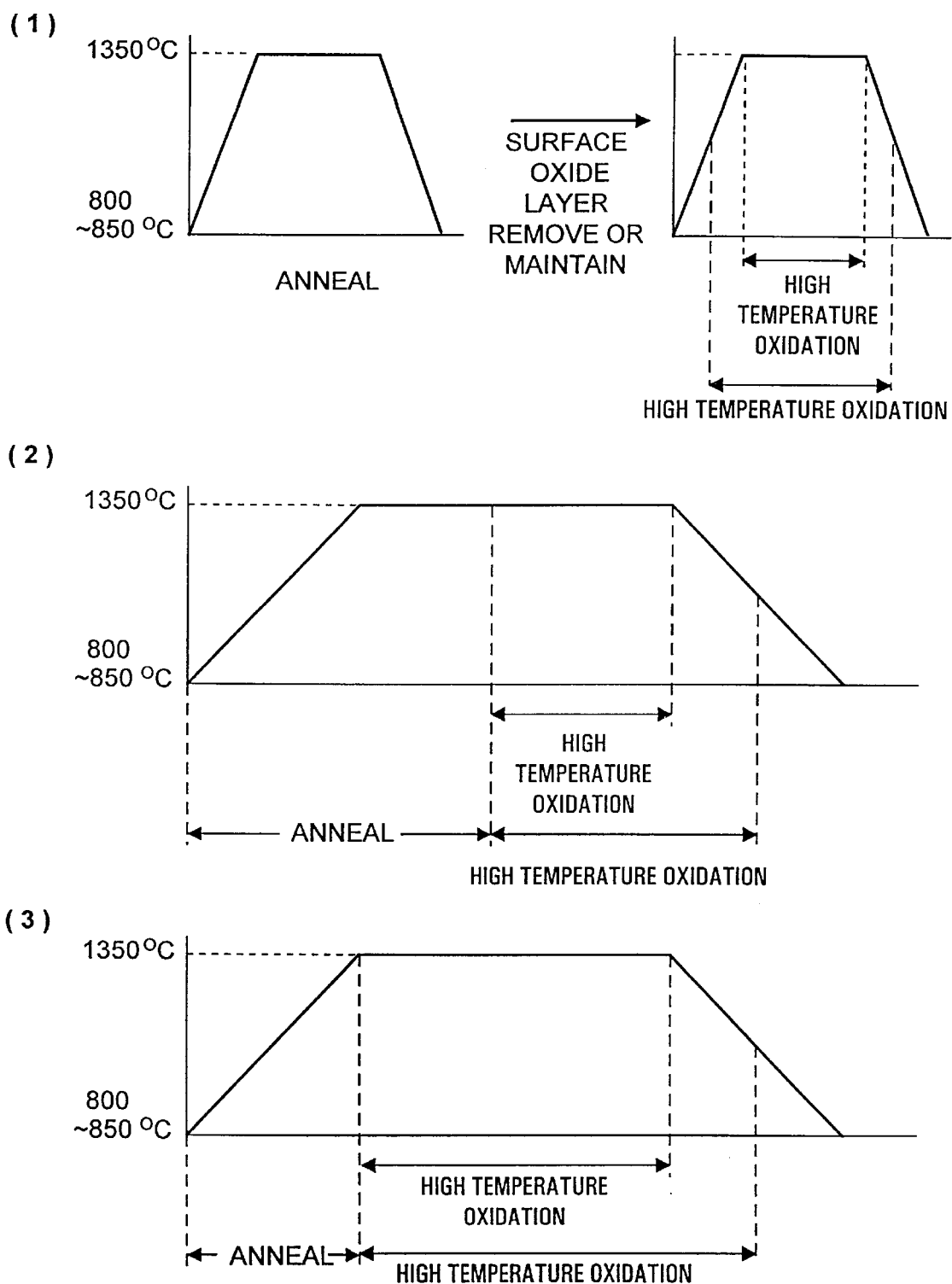
FIG. 2 is an explaining diagram of the relation between the variation in temperature and the high temperature oxidation processing and the anneal of the embodiment carried out the anneal in the heat-up process when the SOI substrate is produced.

The third process of anneal processing can be carried out by simultaneously increasing the temperature and the high temperature oxidation is also available to be conducted after the temperature is increased. Particularly, the substrate to be processed is preliminarily set in the furnace in which the anneal gas is filled up at a predetermined temperature to carry out the above-explained anneal process of the third process and when the furnace temperature exceeds 1200° C., for example reaches at 1350° C., the temperature is maintained. An additional oxygen is added into the thus-conditioned furnace to become an oxygen partial pressure of 70% and thereby the fourth high temperature oxidation process can be carried out. Examples of these processes are shown in FIGS. 2(1)–2(3). In FIG. 2(1), the initial furnace temperature is within a range of 800–850° C., and the furnace is filled up with the anneal gas and its temperature is increased to thereby obtain the buried oxide layer 5. The high temperature oxidation process is conducted independently after the anneal process. The high temperature oxidation process is carried out by increasing the oxygen partial pressure to be a predetermined oxygen concentration of 70% in the furnace, increasing the temperature until 1350° C. and maintaining the temperature of 1350° C. Now referring to FIG. 2(2), it shows that the processes in FIG. 2(1) are successively carried out, in which the high temperature anneal processing is carried out, the oxygen partial pressure in the furnace is increased, and thereafter the high temperature oxidation process is practiced. FIG. 2(3) shows processes in which the anneal processing is practiced while the furnace temperature increases and the high temperature oxidation is thereafter carried out.

However, it is not necessary to set the anneal temperature and the oxidation temperature at the same degree but, for example, the oxidation temperature may be set at 1300° C.

One experimental example under the present invention will hereunder be described.

(1) Implantation of oxygen ions: A dose of oxygen ions volume; $0.4 \times 10^{18}/cm^2$ by an acceleration energy; 180 keV is implanted into the single crystal silicon substrate to form the layer of the highly concentrated implantation of oxygen atmos at a predetermined depth.

(2) Anneal: The anneal temperature is defined at 1350° C. and the buried oxide layer is formed for 4 hours in the atmosphere gas having Ar with $O_2$ defined by the density of 0.5%.

(3) High temperature oxidation: The oxidation temperature is set at 1350° C. and an increase of the buried oxide layer thickness is admitted after four hours. The concentration of $O_2$ is enough to be within a range of over 1% and until 100% but in this example the concentration is controlled at a discharge ratio of 30% and 70% in the argon gas. However, when the $O_2$ concentration is at 1%, it is too small to increase the thickness of the buried oxide layer.

(4) Sacrifice oxidation: The sacrifice oxidation process to decrease the thickness of the surface silicon single crystal layer is practiced at 1100° C. Thereafter, the surface oxide layer is removed to obtain the substrate applied to devices.

The examinations regarding the buried oxide layer thickness, pinhole density and flatness of the buried oxide layer interface are conducted for the buried oxide layer of the SIMOX substrate which is processed under the above-mentioned high temperature oxidation process after the anneal, which will be described as follows.

(1) Thickness of the buried oxide layer: A coordinate relation between the oxidation temperature and the increased thickness of the buried oxide layer is described in FIGS. 3 and 4. The thickness is measured by means of an ellipsometry spectroscope. In FIG. 3, the surface of the silicon single crystal layer is oxidized by about 180 nm and in FIG. 4, the oxidation time is fixed at for four hours and the concentration of $O_2$ is set at 70%. As can be known from these drawings, an increase ratio of the buried oxide layer thickness can be surely increased in response to an increase of the oxidation temperature. If the oxidation temperature is below 1100° C., the increase ratio of the buried oxide layer thickness is slight or if the oxidation time is practical four hours, the increase will be too small to be measured and to obtain a thickness increase effect. But, when the oxidation temperature is over 1350° C., the increased thickness of the buried oxide layer reaches about 30 nm. While, the thickness of the buried oxide layer is 80–90 nm according to the prior art, the thickness of the buried oxide layer becomes 100–110 nm when the oxidation process is practiced at 1350° C. and the thickness of the surface oxide layer is 400 nm.

Figure 7:
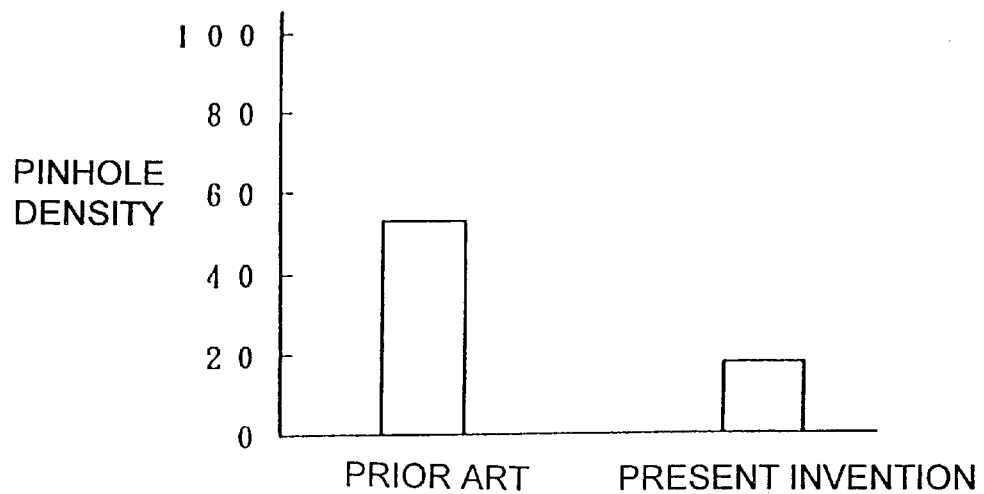
FIG. 7 is a comparative chart of the method according to the present invention with the conventional art about the pinhole density produced in the buried oxide layer.

(2) Pinhole density: As shown in FIG. 7, there is acknowledged about 53 $cm^2$ according to the prior art but in the present invention, the density is decreased to 18 $cm^2$ when the oxidation process is done with the 30% $O_2$ gas at 1350° C. for four hours. Incidentally, by the oxidation process at 1100° C., a thickness increase of the buried oxide layer can not be ascertained and no decrease of the pinhole density is appeared.

Figure 8:
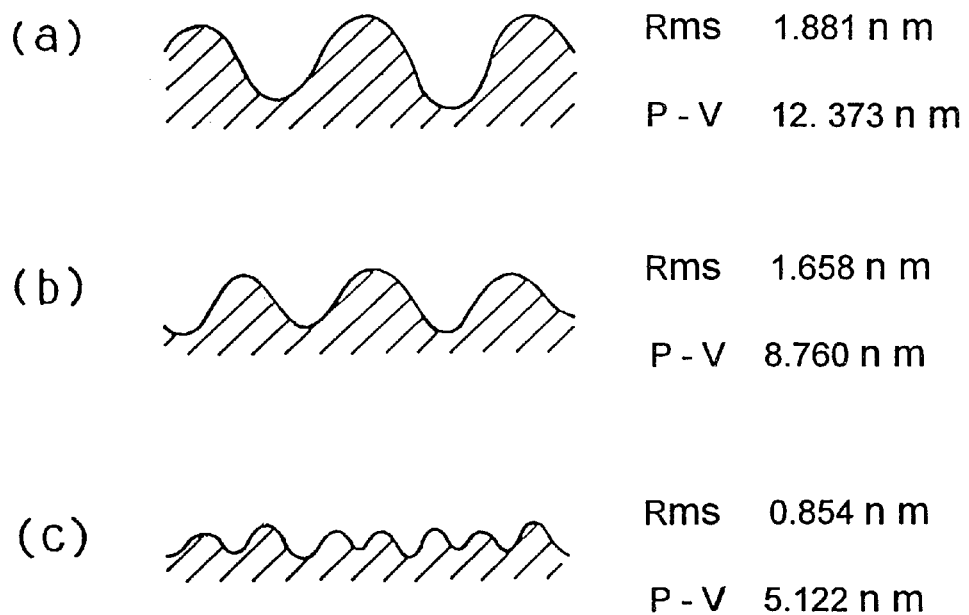
FIG. 8 are schematic partly sectional diagrams of the interface of the surface single crystal silicon layer and the buried oxide layer after implanting the oxygen ions, and (a) shows the conventional SIMOX substrate treated with only the anneal processing, (b) shows the SIMOX substrate treated with the additional treatment by $O_2$ gas concentration of 0.5% and (c) shows the SIMOX substrate treated with oxidation treatment by $O_2$ gas concentration of 30%.
Figure 9:
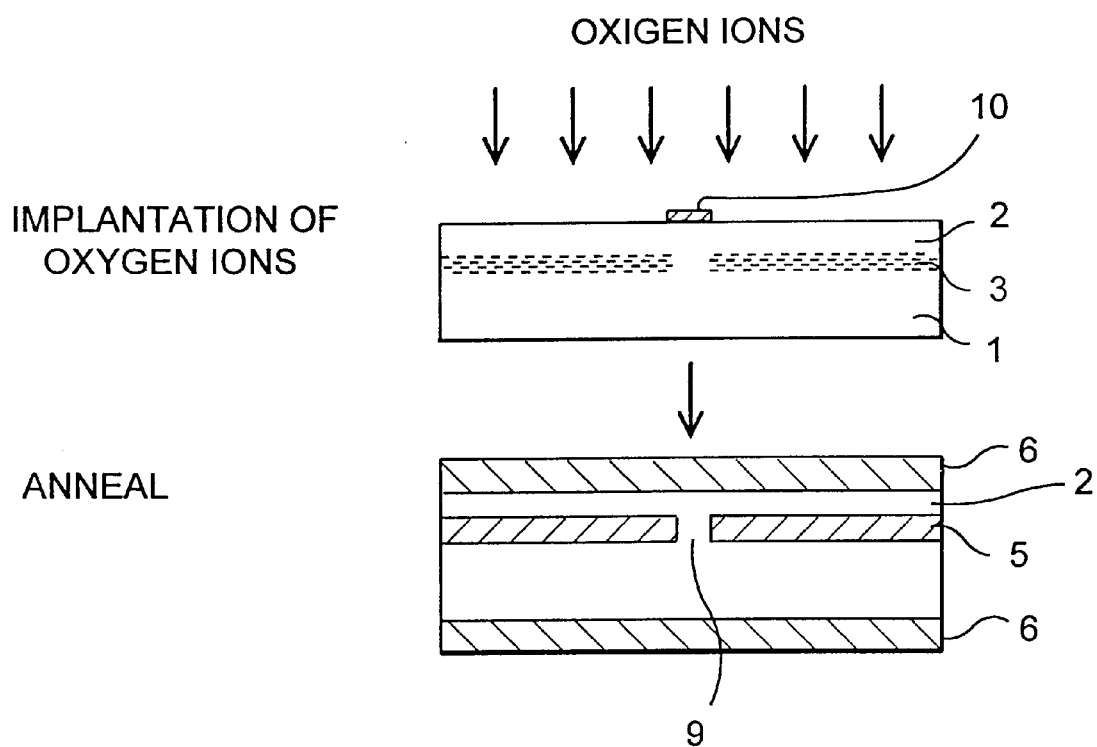
FIG. 9 is an explaining diagram of the masking effect by the particle.
Figure 10:
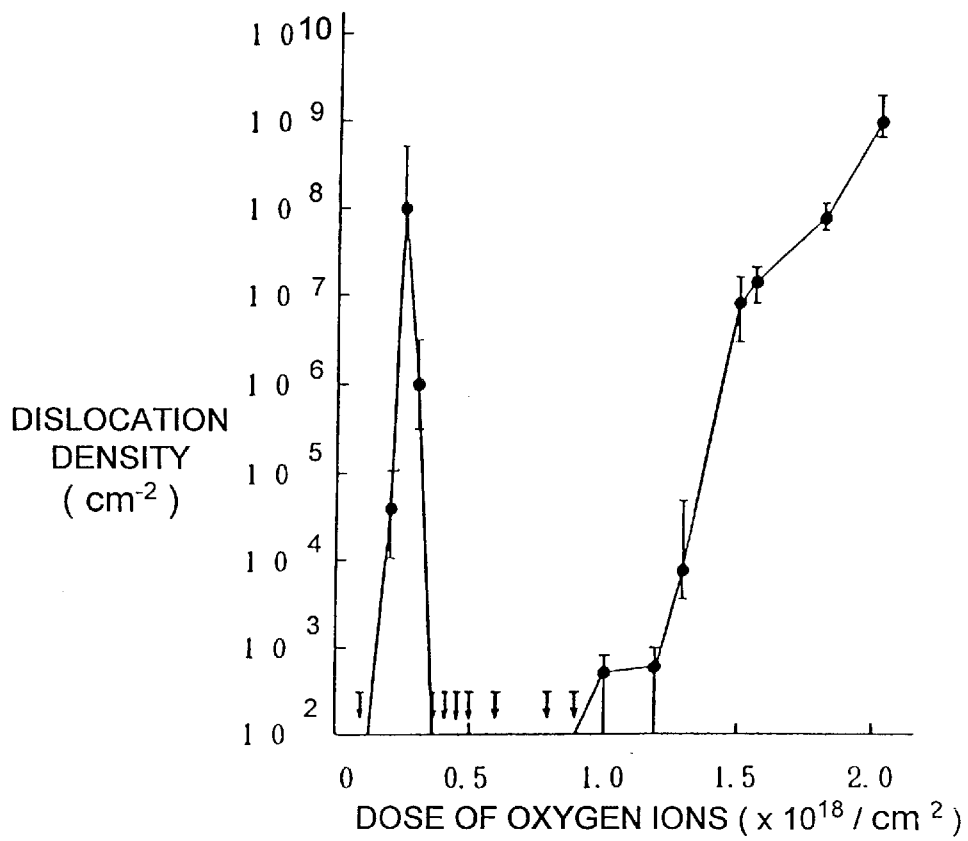
FIG. 10 is a mutual chart of the dislocation density to the dose of the oxygen ions.
Figure 11:
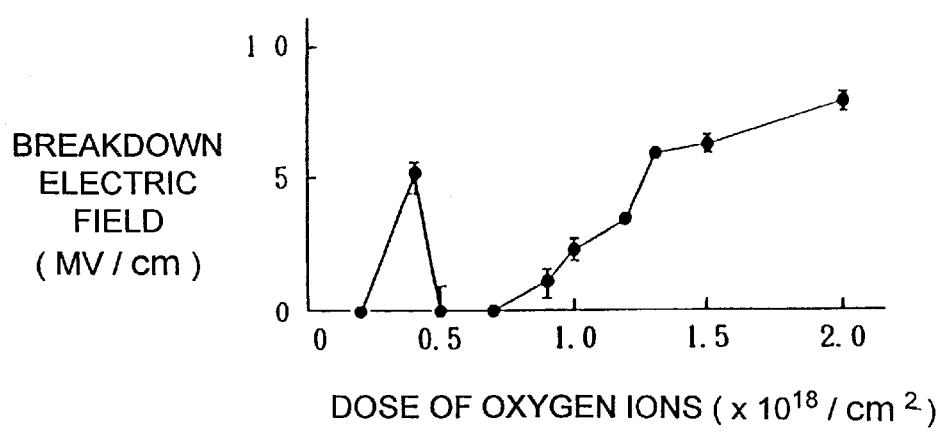
FIG. 11 is a mutual chart of the electric insulation property of the buried oxide layer to the dose of the oxygen ions.

(3) Flatness of the buried oxide layer interface: The examination of flatness degree regarding to the buried oxide layer interface is practiced by removing the surface oxide layer of the SIMOX substrate by means of a delute fluorine, removing the surface silicon single crystal layer by the potassium hydroxide solution, and an irregularity of the buried oxide layer interface can be inspected with an atomic force microscope. FIG. 8(*a*) is a partially sectional view of the buried oxide layer interface when observing the SIMOX substrate in the prior art as a comparative example annealed in an atmosphere of Ar+0.5% $O_2$ at 1350° C. for the anneal process for four hours after implanting the oxygen ions. An micro roughness of the buried oxide layer interface (Rms) is 1.881 nm and a depth from the top to the bottom of the toughness (P–V) is 12.373 nm. FIG. 8(*b*) shows an inspection result of the processed SIMOX substrate as an comparative example which was obtained by that the oxygen ions are implanted, the anneal process is conducted in the atmosphere of Ar+0.5% $O_2$ for four hours at 1350° C., and the additional process is further carried out at 1350° C. for four hours in the atmosphere of Ar+0.5% $O_2$. Since the concentrated oxygen at the oxygen processing is low, it causes the micro roughness (Rms) of the buried oxide layer interface to be 1.658 nm and the depth (P–V) from the top to the bottom of the roughness to be 8.760 nm, which does not show improvements. According to the present invention, the oxygen ions are implanted, the anneal process is conducted in the atmosphere of Ar+0.5% $O_2$ for four hours at 1350° C., and the oxidation process is further carried out at 1350° C. for four hours with 30% $O_2$. As a result, the flatness of the buried oxide layer interface is improved as shown in FIG. 8(*c*) to be the micro roughness (Rms) of 0.854 nm and to be the depth (P–V) from the top to the bottom of the roughness of 5.122 nm.

(4) Electric insulation property: The implanted oxygen ions are $0.4 \times 10^{18}/cm^2$, the pinhole density is decreased to one-third the conventional one, and the thickness of the buried oxide layer is increased, so that the electric insulation property was improved from 40 V to 64 V.

What is claimed is:

1. A method of producing an SOI substrate, comprising the steps of:

a) implanting oxygen ions into a single crystal silicon substrate;

b) forming a buried oxide layer on the silicon substrate from step a) using an annealing process carried out at high temperature in an inert gas atmosphere;

c) forming on the buried oxide layer a surface single-crystal silicon layer electrically insulated from the substrate by continuing the annealing process until the thickness of buried oxide layer reaches a given value theoretically calculated based on the dose of implanted oxygen; and d) oxidizing the substrate at a temperature of at least about 1150° C., but less than the melting temperature of the single-crystal silicon substrate, and at an oxygen partial pressure of oxygen such that the oxygen concentration is greater than 1%.

2. The method of producing the SOI substrate according to claim 1, wherein said oxidation step after the anneal process is practiced in an oxygen gas atmosphere of which concentration is higher than that in the anneal process.

* * * * *